(12) United States Patent
Watanabe

(10) Patent No.: US 6,249,442 B1
(45) Date of Patent: Jun. 19, 2001

(54) STRUCTURE FOR MOUNTING TWO PRINTED CIRCUIT BOARDS TO ONE CASE

(75) Inventor: Hideki Watanabe, Fukushima-ken (JP)

(73) Assignee: Alps Electric Co., LTD, Tokyo (JP)

( * ) Notice: Subject to any disclaimer, the term of this patent is extended or adjusted under 35 U.S.C. 154(b) by 0 days.

(21) Appl. No.: 09/441,597

(22) Filed: Nov. 17, 1999

(30) Foreign Application Priority Data

Nov. 25, 1998 (JP) .................................................. 10-333796

(51) Int. Cl.[7] ............................... H05K 5/00; H05K 7/14
(52) U.S. Cl. .................... 361/801; 361/752; 361/753; 361/758; 361/807; 174/138 E; 220/4.02
(58) Field of Search .................................... 361/728, 736, 361/752, 753, 758, 759, 796, 801, 807; 174/50, 52.1, 138 G; 220/4.02

(56) References Cited

U.S. PATENT DOCUMENTS

| | | | |
|---|---|---|---|
| 4,200,900 | * | 4/1980 | McGeorge ............................ 361/803 |
| 4,855,873 | * | 8/1989 | Bhargave et al. ..................... 381/818 |
| 5,111,362 | * | 5/1992 | Flamm et al. ........................ 361/736 |
| 5,575,686 | * | 11/1996 | Noschese ............................. 439/620 |
| 5,715,141 | * | 2/1998 | Karlsson .............................. 361/707 |
| 6,027,345 | * | 2/2000 | McHugh et al. ........................ 439/66 |

FOREIGN PATENT DOCUMENTS 8-153986  6/1996  (JP) .
9-331180  12/1997 (JP) .

* cited by examiner

Primary Examiner—Jayprakash N. Gandhi
(74) Attorney, Agent, or Firm—Brinks Hofer Gilson & Lione

(57) ABSTRACT

A printed circuit board mounting structure is disclosed wherein first and second printed circuit boards are mounted by mounting projections formed on a case. Since the mounting projections can be used in common for both first and second printed circuit boards, the printed circuit board mounting structure of the invention is simple in the mounting work, high in productivity and low in cost as compared with a conventional like structure wherein first and second printed circuit boards are mounted to different mounting projections.

4 Claims, 3 Drawing Sheets

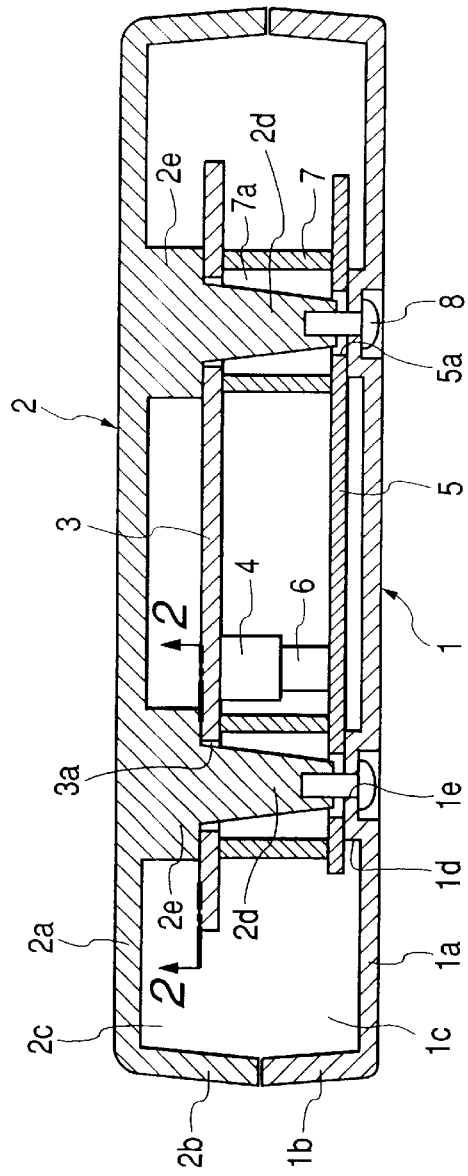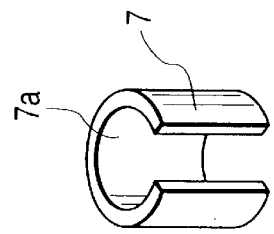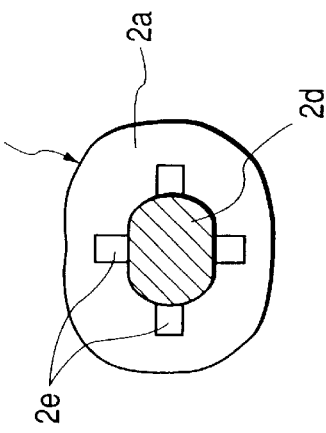

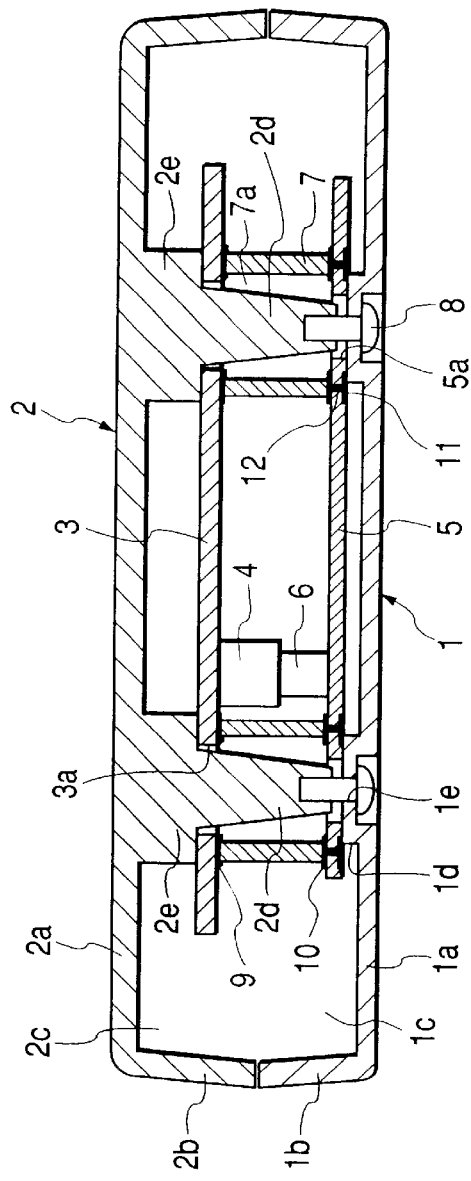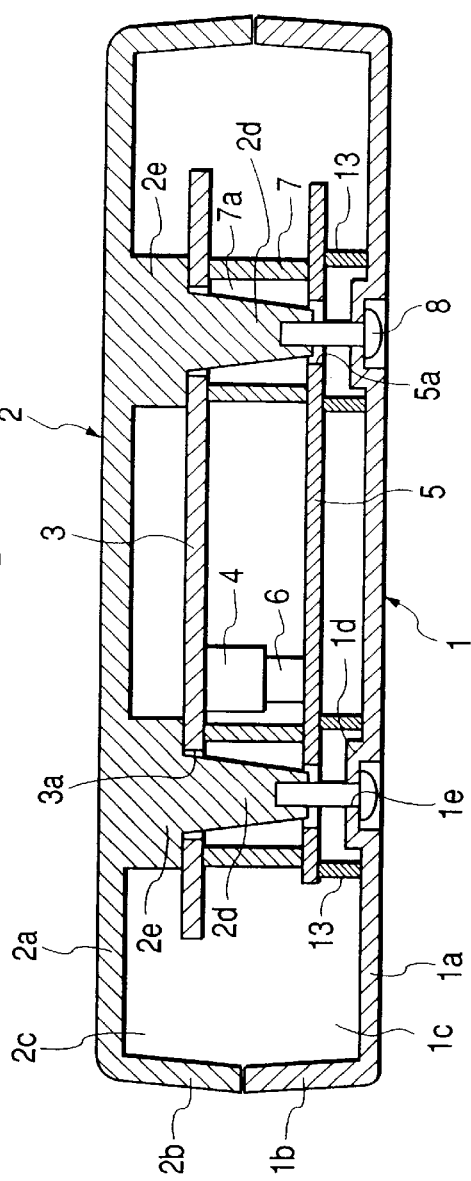

STRUCTURE FOR MOUNTING TWO PRINTED CIRCUIT BOARDS TO ONE CASE

BACKGROUND OF THE INVENTION

1. Field of the Invention

The present invention relates to a printed circuit mounting structure suitable for use in a transmitter-receiver of a personal computer for example.

2. Description of the Prior Art

As an example, a conventional printed circuit mounting structure applied to a data transmitter-receiver of a personal computer will now be described with reference to FIG. 6. A case 21, which is formed in a box shape using a metallic plate, comprises a flat plate-lie bottom wall 21a, side walls 21b bent upward from side edges of the bottom wall 21a, an accommodating portion 21c surrounded with the bottom wall 21a and side walls 21b, projecting portions 21d formed on the bottom wall 21a so as to project into the accommodating portion 21c, and holes 21e formed in the projecting portions 21d.

A case 22 formed by molding a synthetic resin comprises an upper wall 22a, side walls 22b formed downward from peripheral edges of the upper wall 22a, an accommodating portion 22c surrounded with the upper wall 22a and side walls 22b, a plurality of long mounting projections 22d positioned in the accommodating portion 22c and projecting downward from the upper wall 21a, a plurality of mounting projections 22e of a medium length projecting downward from the upper wall 21a, and a plurality of short mounting projections 22f projecting downward from the upper wall 21a.

A first printed circuit 23 having a plurality of holes 23a and 23b is formed with a plurality of holes 23a, 23b and carries various electric components (not shown) and a connector 24 thereon. A high-frequency circuit is formed on the first printed circuit board 23.

A second printed circuit board 25 having a plurality of holes 25a is formed with electrically conductive patterns (not shown) and carries various electric components (not shown) and a connector 26 thereon. A low-frequency circuit such as a logic circuit is formed on the second printed circuit board 25.

The first printed circuit board 23 is mounted in the following manner. With the mounting projections 22e inserted into the holes 23b, the first printed circuit board 23 is put on the tops of the mounting projections 22f and thereafter a plurality of screws 27 are threaded into the mounting projections 22f through the holes 23a, thereby mounting the first printed circuit board 23 to the mounting projections 22f.

The second printed circuit board 25 is mounted in the following manner. First, the connector 26 is inserted into the connector 24, then the second printed circuit board 25 is put on the tops of the mounting projections 22e and a plurality of screws 28 are threaded into the mounting projections 22e through the holes 25a, thereby mounting the second printed circuit board 25 to the mounting projections 22e.

The case 21 is mounted in the following manner. The projecting portions 21d are put on the tops of the mounting projections 22d and thereafter a plurality of screws 29 are threaded into the mounting projections 22d through the holes 21e, thereby mounting the case 21 to the mounting projections 22d.

The first and second printed circuit boards 23, 25 thus assembled are then received into the accommodating portions 21c and 22c.

In the conventional printed circuit board mounting structure, the first and second printed circuit boards 23, 25 are mounted to different mounting projections 22e and 22f respectively, thus giving rise to the problem that the mounting work is troublesome, productivity is low, and cost increases.

Also as to the case 21, since it is mounted to the mounting projections 22d different from the mounting projections for the printed circuit boards 23 and 25, there arises the problem that the number of mounting steps increases, productivity is low, and cost increases.

SUMMARY OF THE INVENTION

It is an object of the present invention to solve the above-mentioned problems.

According to a first embodiment of the present invention for solving the above-mentioned problems there is provided a printed circuit board mounting structure comprising a case formed by molding a synthetic resin, a plurality of mounting projections formed on the case, two, first and second printed circuit boards having electrically conductive patterns and holes, spacers interposed between the first and second printed circuit boards and having holes, a mounting body having holes and constituting a chassis, and screws for mounting the first and second printed circuit boards to the mounting body, wherein the mounting projections are inserted into the holes of the first and second printed circuit boards and the holes of the spacers, and the screws are inserted into the holes of the mounting body and are threaded into the tops of the mounting projections to push the first and second printed circuit boards and the spacers to the case side through the mounting body.

According to a second embodiment of the present invention for solving the foregoing problems, with the mounting projections not inserted through the holes of the second printed circuit board disposed on the mounting body side, the tops of the mounting projections are positioned in proximity to the mounting body and a part of the mounting body is brought into abutment against the second printed circuit board, causing the mounting body to push the second printed circuit board.

According to a third embodiment of the invention, the spacers are formed using a metallic material and end portions of the spacers are brought into abutment with the electrically conductive patterns formed on the first and second printed circuit boards to provide a connection between the patterns on both printed circuit boards through the spacers.

According to a fourth embodiment of the invention, the mounting body is formed using a metallic material, electrically conductive patterns are formed on both sides of the second printed circuit board, connecting conductors are provided in through holes formed in the second printed circuit board to connect the electrically conductive patterns formed on both sides of the board with each other, one electrically conductive patterns are brought into abutment with the mounting body and the other brought into abutment with end portions of the spacers, to connect earth electrodes on the first and second printed circuit boards to the mounting body.

BRIEF DESCRIPTION OF THE DRAWINGS

FIG. 1 is a sectional view of a printed circuit board mounting structure according to the first embodiment of the present invention;

FIG. 2 is a sectional view taken on line 2—2 in FIG. 1;

FIG. 3 is a perspective view of a spacer used in the printed circuit board mounting structure of the first embodiment;

FIG. 4 is a sectional view of a printed circuit board mounting structure according to the second embodiment of the present invention;

FIG. 5 is a sectional view of a printed circuit board mounting structure according to the third embodiment of the present invention.

DETAILED DESCRIPTION OF PREFERRED EMBODIMENTS

Figure 6:
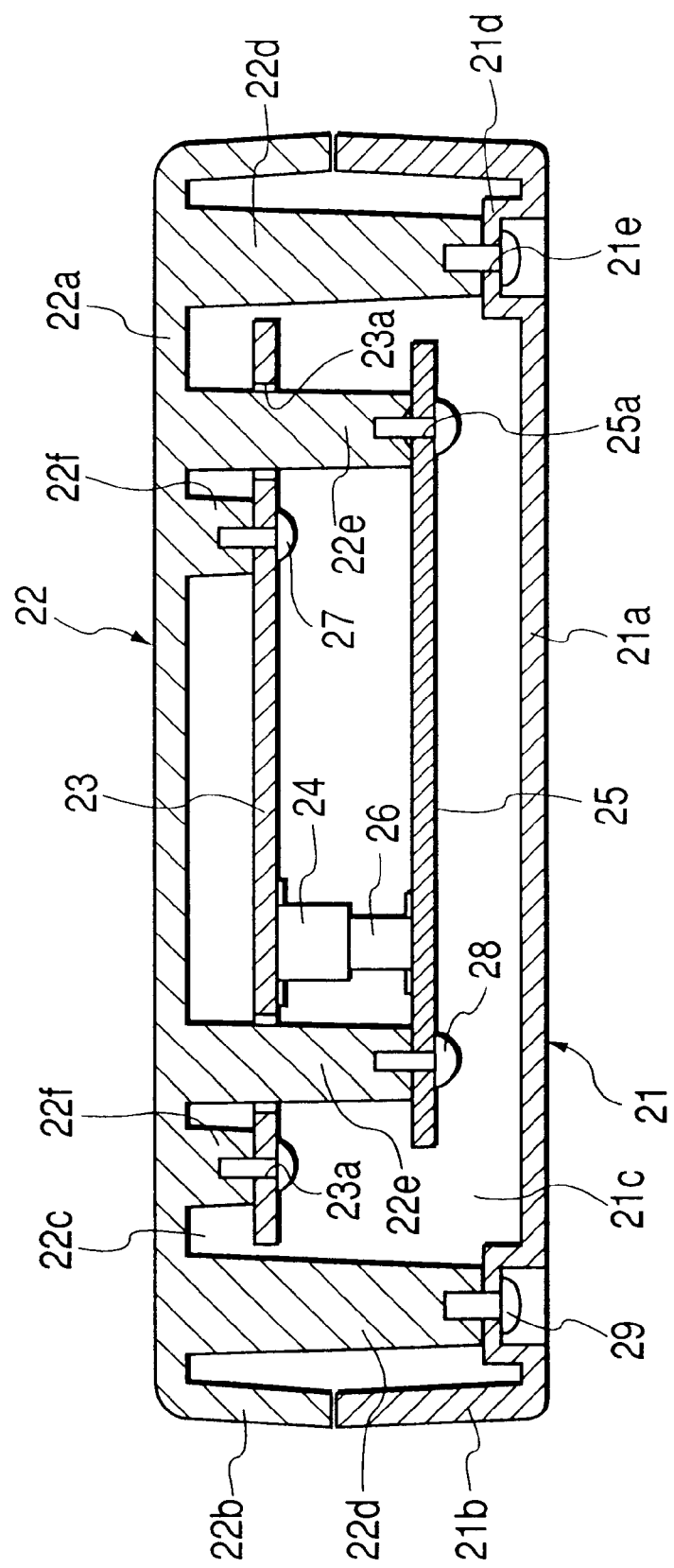
FIG. 6 is a sectional view of a conventional printed circuit board mounting structure.

With a data transmitter-receiver of a personal computer as an example, a printed circuit board mounting structure according to the first embodiment of the present invention will be described below with reference to FIGS. 1 to 3, of which FIG. 1 is a sectional view of the mounting structure, FIG. 2 is a sectional view taken on line 2—2 in FIG. 1, and FIG. 3 is a perspective view of a spacer used in the mounting structure.

A mounting body 1, which is formed in a box shape using a metallic plate and which constitutes a case, comprises a flat plate-like bottom wall 1a, side walls 1b bent upward from peripheral edges of the bottom wall 1a, an accommodating portion 1c surrounded with the bottom wall 1a and side walls 1b, projecting portions 1d formed on the bottom wall 1a so as to project into the accommodating portion 1c, and holes 1e formed in the projecting portions 1d.

The mounting body 1 may be a chassis and, if necessary, it may be formed using an insulating synthetic resin material.

A case 2, which is formed by molding a synthetic resin, comprises an upper wall 2a, side walls 2b formed downward from peripheral edges of the upper wall 2a, an accommodating portion 2c surrounded with the upper wall 2a and side walls 2b, a plurality of relatively long mounting projections 2d projecting downward from the upper wall 1a, and pedestal portions 2e formed in the shape of a cross at a base portion of each of the mounting projections 2d.

The shape of the pedestal portions 2e is not specially limited. For example, it may be cylindrical.

A first printed circuit board 3 having a plurality of holes 3a is formed with electrically conductive patterns (not shown) and it carries various electric components (not shown) and a connector 4 thereon. A high-frequency circuit is formed on the first printed circuit board 3.

A second printed circuit board 5 having a plurality of holes 5 has electrically conductive patterns (not shown) formed thereon and various electric components (not shown) and a connector 6 mounted thereon. A low-frequency circuit such as a logic circuit is formed on the second printed circuit board 5.

Spacers 7 formed of a metallic material are each in the form of a ring, with a hole 7a formed centrally, a shown in FIG. 3.

The first and second printed circuit boards 3, 5 are mounted in the following manner. First, the holes 3a of the first printed circuit board 3 are fitted on the mounting projections 2d and the first printed circuit board is put on the pedestal portions 2e.

Next, the spacers 7 are fitted on the mounting projections 2d and are put on the first printed circuit board 3, then the connector 6 is inserted into the connector 4, and with the holes 5a aligned with the tops of the mounting projections 2d, the second printed circuit board 5 is put on end portions of the spacers 7.

Further, the projecting portions 1d of the mounting body 1 are put on the second printed circuit board 5, then a plurality of screws 8 are threaded into the tops of the mounting projections 2d through the holes 1e, allowing the mounting body 1 to push the first and second printed circuit boards 3, 5 and the spacers 7 against the case 2 side, that is, against the pedestal portions 2e, thereby mounting the mounting body 1 and the first and second printed circuit board 3, 5 with each other.

In this mounting operation, when the second printed circuit board 5 is put on the spacers 7, the tops of the mounting projections 2d are in proximity to the mounting body 1, not passing through the holes 5a.

In this way the first and second printed circuit boards 3, 5 are received within the accommodating portions 1c and 2c of the mounting body 1 and the case 2.

Referring now to FIG. 4, there is illustrated a printed circuit board mounting structure according to the second embodiment of the present invention. In this second embodiment, spacers 7 are formed using a metallic material, electrically conductive patterns 9 are formed on the first printed circuit board 3, while electrically conduct patterns 10 are formed on one side of the second printed circuit board 5, end portions of the spacers 7 are brought into abutment with the electrically conductive patterns 9 and 10 to connect the patterns 9 and 10 with each other through the spacers 7, electrically conductive patterns 11 are formed on the other side of the second printed circuit board 5, the patterns 10 and 11 are connected together through connecting conductors 12 formed in through holes, and the patterns 11 are brought into contact with the mounting body 1, whereby the patterns 9 and 10, when used for earthing the first and second printed circuit boards 3, 5, are earthed to the mounting body 1.

Other constructional points are the same as in the previous first embodiment, so are identified by the same reference numerals as in the first embodiment and explanations thereof are here omitted.

Referring now to FIG. 5, there is illustrated a printed circuit board mounting structure according to the third embodiment of the present invention. In this third embodiment, the mounting body 1 and first and second printed circuit boards 3, 5 are mounted together through spacers 13.

Other constructional points are the same as in the first embodiment, so are identified by the same reference numerals as in the first embodiment and explanations thereof are here omitted.

According to the printed circuit board mounting structure of the present invention, as set forth above, since the first and second printed circuit boards 3, 5 are mounted by the mounting projections 2d formed on the case 2, the mounting projections 2d can be used in common and both printed circuit boards can be mounted in a simple manner as compared with the prior art, thus affording a printed circuit board mounting structure high in productivity and low in cost.

Moreover, since the mounting body 1 can be installed simultaneously with the installation of the printed circuit boards 3 and 5, there can be attained a further improvement of productivity and a further reduction of cost.

Further, since the tops of the mounting projections 2d are positioned in proximity to the mounting body 1 and the mounting body 1 is abutted against the second printed circuit board 5 with the mounting projections 2d not inserted through the holes 5a of the second printed circuit board 5, spacers are not needed between the mounting body 1 and the second printed circuit board 5, thus affording a printed circuit board mounting structure reduced in the number of components used, high in productivity and low in cost.

Further, since the electrically conductive patterns 9 and 10 formed on the first and second printed circuit boards 3, 5 are connected together through metallic spacers 7, the spacers 7 also serve as connectors and therefore it is possible to provide a printed circuit board mounting structure which is simple in a connecting construction.

Further, since the electrically conductive patterns 10 and 11 formed on both sides of the second printed circuit board 5 are connected together through connecting conductors 12 and the patterns 11 are brought into contact with a metallic mounting body 1, the patterns 9 and 10 when used for earthing can be earthed to the mounting body 1 through spacers 7, thus affording a printed circuit board mounting structure which is simple in an earthing construction.

What is claimed is:

1. A printed circuit board mounting structure comprising:

a case formed by molding a synthetic resin;

a plurality of mounting projections formed on said case;

first and second printed circuit boards having electrically conductive patterns and holes;

spacers interposed between said first and second printed circuit boards and having holes;

a mounting body having holes and constituting a chassis; and screws for mounting said first and second printed circuit boards to said mounting body, wherein said mounting projections are inserted into the holes of said first and second printed circuit boards and the holes of said spacers, and said screws are inserted into the holes of said mounting body and are threaded into the tops of said mounting projections to push said first and second printed circuit boards and said spacers to said case by the mounting body.

2. A printed circuit board mounting structure according to claim 1, wherein, with said mounting projections not inserted through the holes of said second printed circuit board disposed on said mounting body, the tops of the mounting projections are positioned in proximity to said mounting body and a part of the mounting body is brought into abutment against the second printed circuit board, causing the mounting body to push the second printed circuit board.

3. A printed circuit board mounting structure according to claim 1, wherein said spacers are formed using a metallic material and end portions of the spacers are brought into abutment with said electrically conductive patterns formed on said first and second printed circuit boards to provide a connection between said patterns on both said printed circuit boards through said spacers.

4. A printed circuit board mounting structure according to claim 3, wherein said mounting body is formed using a metallic material, electrically conductive patterns are formed on both sides of said second printed circuit board, connecting conductors are provided in through holes formed in the second printed circuit board to connect the electrically conductive patterns formed on both sides of the second printed circuit board with each other, one electrically conductive pattern is brought into abutment with said mounting body and the other brought into abutment with end portions of said spacers, to connect earth electrodes on the first and second printed circuit boards to said mounting body.

* * * * *